(12) United States Patent
Kim et al.

(10) Patent No.: US 10,477,696 B2
(45) Date of Patent: Nov. 12, 2019

(54) FINE INTERVAL COATING MEMBER FOR LED DISPLAY AND COATING METHOD USING THE SAME

(71) Applicant: SAMSUNG ELECTRONICS CO., LTD., Gyeonggi-do (KR)

(72) Inventors: Jae-sang Kim, Seoul (KR); Jee-su Park, Hwaseong-si (KR); Jae-Min Lee, Suwon-si (KR); Suk Hyun, Suwon-si (KR); Chang-won Ryu, Suwon-si (KR); Tae-hyeun Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/104,459

(22) Filed: Aug. 17, 2018

(65) Prior Publication Data

US 2018/0359863 A1  Dec. 13, 2018

Related U.S. Application Data

(62) Division of application No. 15/266,567, filed on Sep. 15, 2016, now Pat. No. 10,080,296.

(30) Foreign Application Priority Data

Sep. 22, 2015  (KR) .................. 10-2015-0134181

(51) Int. Cl.
*H05K 3/38* (2006.01)
*H01L 33/54* (2010.01)
(Continued)

(52) U.S. Cl.
CPC .......... *H05K 3/284* (2013.01); *B29C 64/135* (2017.08); *H01L 27/156* (2013.01);
(Continued)

(58) Field of Classification Search
None
See application file for complete search history.

(56) References Cited

U.S. PATENT DOCUMENTS 8,222,059 B2   7/2012  Ashida
2010/0203658 A1  8/2010  Aida et al.
(Continued)

FOREIGN PATENT DOCUMENTS

EP   0 864 431 A1   9/1998
JP   8-282006 A    10/1996
(Continued)

OTHER PUBLICATIONS

International Search Report dated Jan. 4, 2017, issued by the International Searching Authority in counterpart International Patent Application No. PCT/KR2016/010457 (PCT/ISA/210).
(Continued)

*Primary Examiner* — Mounir S Amer
(74) *Attorney, Agent, or Firm* — Sughrue Mion, PLLC

(57) ABSTRACT

A fine interval coating member for a LED display and a coating method using the same are provided. The coating member includes column portions and row portions crossing the column portions, and holes between the column portions and the row portions. The body portion includes a material that is melted at a temperature higher than room temperature and that is cured at the room temperature.

6 Claims, 21 Drawing Sheets

(51) Int. Cl.
*H01L 27/15* (2006.01)
*H01L 33/04* (2010.01)
*H05K 3/28* (2006.01)
*H01L 33/44* (2010.01)
*H01L 33/00* (2010.01)
*B29C 64/135* (2017.01)
*B29C 35/04* (2006.01)
*B29K 77/00* (2006.01)
*B29K 75/00* (2006.01)
*B29K 101/12* (2006.01)
*B29L 31/34* (2006.01)

(52) U.S. Cl.
CPC .......... *H01L 33/0095* (2013.01); *H01L 33/44* (2013.01); *H01L 33/54* (2013.01); *B29C 2035/046* (2013.01); *B29C 2791/009* (2013.01); *B29K 2075/00* (2013.01); *B29K 2077/00* (2013.01); *B29K 2101/12* (2013.01); *B29L 2031/3475* (2013.01); *H01L 2933/005* (2013.01); *H01L 2933/0025* (2013.01); *H05K 2201/0129* (2013.01); *H05K 2201/10106* (2013.01); *H05K 2201/10128* (2013.01)

(56) References Cited

U.S. PATENT DOCUMENTS

| | | |
|---|---|---|
| 2010/0320482 A1 | 12/2010 | Tachibana |
| 2011/0073880 A1 | 3/2011 | Lee et al. |
| 2012/0068208 A1 | 3/2012 | Tseng et al. |
| 2013/0170203 A1 | 7/2013 | Cheng et al. |
| 2015/0004726 A1 | 1/2015 | Konishi |
| 2015/0116970 A1 | 4/2015 | Kishi et al. |
| 2015/0162498 A1 | 6/2015 | Jang et al. |
| 2015/0180208 A1 | 6/2015 | Kaneko et al. |
| 2016/0355711 A1 | 12/2016 | Okamoto et al. |

FOREIGN PATENT DOCUMENTS

| | | |
|---|---|---|
| JP | 11-145194 A | 5/1999 |
| JP | 2013-258006 A | 12/2013 |
| KR | 10-0787463 B1 | 12/2007 |
| KR | 10-2012-0100793 A | 9/2012 |
| KR | 10-2015-0069195 A | 6/2015 |

OTHER PUBLICATIONS

Written Opinion dated Jan. 4, 2017, issued by the International Searcing Authority in counterpart International Patent Application No. PCT/KR2016/010457 (PCT/ISA/237).

FINE INTERVAL COATING MEMBER FOR LED DISPLAY AND COATING METHOD USING THE SAME

CROSS-REFERENCE TO RELATED APPLICATION

This is a divisional application of U.S. patent application Ser. No. 15/266,567, filed Sep. 15, 2016, in the U.S. Patent and Trademark Office, which claims priority from Korean Patent Application No. 10-2015-0134181, filed on Sep. 22, 2015, in the Korean Intellectual Property Office, the disclosures of which are incorporated herein by reference in their entireties.

BACKGROUND

1. Field

Apparatuses and methods consistent with exemplary embodiments relate to a coating member and a coating method using the same.

2. Description of the Related Art

In light emitting diode (LED) displays, an LED display screen may be formed by arranging LED elements that emit lights for red (R), green (G), and blue (B) in a grid form or by arranging packages, in which R, G, and B elements are packaged in one, in a grid form. An LED cabinet having a large size may be manufactured by coupling the LED displays mounted with the LED elements like tiles, and a multi-display having a large size may be manufactured by coupling the LED cabinets like tiles. The multi-display may be used in outdoor billboards and the like. Accordingly, for anti-static and waterproof processing, the coating for preventing the reduction in the withstand voltage and the waterproof coating may be formed on a front surface portion of the multi-display, or a protection film may be formed on the front surface portion.

However, only a desired portion such as a gap between the LED elements may be coated due to the reasons such as screen distortion prevention in the LED display coating in the related art. In response to an interval between the LED elements being fine, a coating method using dispensing processing or a taping method in the related art may be used to perform blank coating on a front surface of the LED display, and thus the partial coating may not be accomplished through the dispensing coating method or the taping method.

The LED display in which a bonding portion between a printed circuit board (PCB) uncoated with the coating material and the LED element is exposed may be used in the related art, and thus the LED display may be susceptible in terms of the prevention of reduction in the withstand voltage, waterproof, and the like. To complement this, a dispensing coating method for the front surface portion of the display may be used. For example, the dispensing method may coat silicon, epoxy, and the like in a liquid form and perform curing through heat or ultraviolet. However, in response to the dispensing method being used, a coating surface may be formed even in a surface of a light emitting portion of the LED element, and thus an undesired optical side effect may result.

SUMMARY

Exemplary embodiments may address at least the above problems and/or disadvantages and other disadvantages not described above. Also, the exemplary embodiments are not required to overcome the disadvantages described above, and may not overcome any of the problems described above.

Exemplary embodiments provide a fine interval coating member for a LED display capable of being selectively coated in a shape in which coating is difficult through the LED display coating processing in the related art, or only in a desired portion, and a coating method using the same.

According to an aspect of an exemplary embodiment, there is provided a coating member including a body portion including column portions and row portions crossing the column portions, and holes between the column portions and the row portions. The body portion includes a material that is melted at a temperature higher than room temperature and that is cured at the room temperature.

The body portion may have a mesh shape.

The body portion may be flexible.

The body portion may include a thermoplastic resin.

The body portion may include a material that is melted by a solvent and that is cured at the room temperature.

Each of the column portions and the row portions may include a top surface including ends that include inclined surfaces, and a bottom surface including ends that include inclined surfaces.

Each of the column portions and the row portions may include a top surface including ends that include rounding portions having a curvature, and a bottom surface including ends that include rounding portions having the curvature.

According to an aspect of an exemplary embodiment, there is provided a method of coating a front surface of a display, the method including forming a coating member having a shape corresponding to a portion of a display to be coated, forming the coating member on the display, melting the coating member formed on the display so that the melted coating member fills a space disposed between light emitting diode (LED) elements included in the display, and curing the melted coating member by cooling the melted coating member.

The forming of the coating member may include forming the coating member in a mesh shape.

The forming of the coating member may include forming the coating member through any one or any combination of a molding process, a process using a three-dimensional printer, and a laser cutting process.

The forming of the coating member on the display may include inserting the LED elements into holes included in the coating member.

The melting of the coating member formed on the display may include exposing the coating member formed on the display to hot air that is discharged at a temperature, for a period of time.

The melting of the coating member formed on the display may include loading the display on which the coating member is formed into a melting chamber, and exposing the coating member formed on the display to heat that is emitted at a temperature.

The melting of the coating member formed on the display may include coating a solvent for melting the coating member, on the coating member formed on the display.

The melting of the coating member formed on the display may include melting the coating member formed on the display so that the melted coating member flows and contacts a bonding portion between the LED elements and a printed circuit board included in the display.

The body portion may include a thermoplastic resin.

According to an aspect of an exemplary embodiment, there is provided a display including a printed circuit board (PCB), light emitting diode (LED) elements disposed on the PCB, and a coating member including a body portion disposed between the LED elements and disposed on the PCB, and holes into which the LED elements are inserted. A height of body portion is less than a height of the LED elements.

The body portion may have a shape filling the space disposed between the LED elements.

The body portion may include column portions and row portions crossing the column portions, and a width of each of the column portions and the row portions may be less than or equal to a distance between each adjacent pair of the LED elements.

The body portion may include column portions and row portions crossing the column portions, and a height of each of the column portions and the row portions may be less than or equal to a height of each of the LED elements.

The body portion may be deformed to a shape corresponding to a surface of PCB.

The body portion may contact a side of each of the LED elements, and contact a surface of the PCB.

BRIEF DESCRIPTION OF THE DRAWINGS

The above and/or other aspects will be more apparent by describing exemplary embodiments with reference to the accompanying drawings, in which.

DETAILED DESCRIPTION OF THE EXEMPLARY EMBODIMENTS

Figure 1:
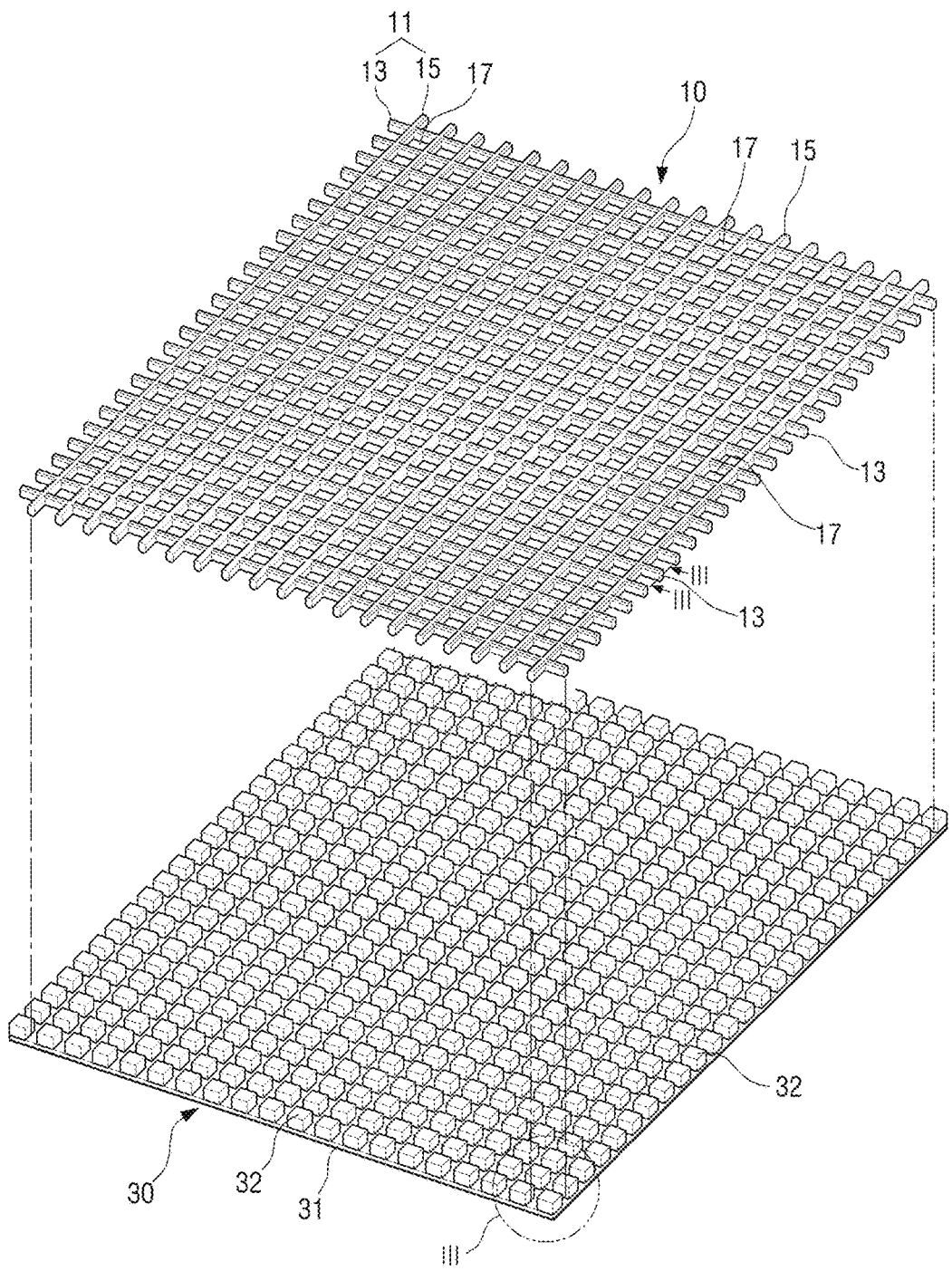
FIG. 1 is a perspective view illustrating a fine interval coating member for a LED display, and an LED display mounted with a plurality of LED elements arranged in a matrix form in a PCB, according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

It will be understood that the terms first, second, third, etc. may be used herein to describe various elements and/or components regardless of the order and/or importance, and these elements and/or components may not be limited by these terms. These terms are only used to distinguish one element or component. For example, a first user apparatus and a second user apparatus may refer to user apparatuses different from each other regardless of the order or importance. Thus, without departing from the scope in the document, a first element and/or component discussed below could be termed a second element and/or component, and vice versa.

The terminology used herein is for the purpose of describing exemplary embodiments only and is not intended to be limiting of the present inventive concept. As used herein, the singular forms "a," "an" and "the" are intended to include the plural forms as well, unless the context clearly indicates otherwise. Unless otherwise defined, all terms including technical and scientific terms used herein have the same meaning as understood by one of ordinary skill in the art to which this inventive concept belongs. It will be further understood that terms, such as those defined in dictionaries, may be interpreted as having a meaning that is consistent with their meaning in the context of the relevant art and will not be interpreted in an idealized or overly formal sense unless expressly so defined herein. In some cases, the terms defined in the document may not be interpreted to exclude embodiments herein.

It will be understood that the terms "comprises" and/or "comprising" used herein specify the presence of stated features or components, but do not preclude the presence or addition of one or more other features or components.

Hereinafter, a coating member for an LED display and a method of coating the coating member in a space between LED elements arranged in a PCB at fine intervals according to an exemplary embodiment, will be described in detail with the accompanying drawings.

A structure of a fine interval coating member for an LED display according to an exemplary embodiment will be described with reference to FIGS. 1, 2, and 3.

FIG. 1 is a perspective view illustrating a fine interval coating member for a LED display, and an LED display mounted with a plurality of LED elements arranged in a matrix form in a PCB, according to an exemplary embodiment. FIG. 2 is an enlarged diagram illustrating a portion III indicated in FIG. 1. FIG. 3 is a cross-section diagram illustrating a column member illustrated in FIG. 1

Referring to FIG. 1, a coating member 10 according to an exemplary embodiment may substantially have a mesh shape having a net knot to be coupled to an LED display 30 in which a plurality of LED elements 32 are arranged in a PCB 31 in a matrix form.

The coating member 10 includes a body portion 11 that includes a plurality of column members 13 arranged in parallel to be spaced at a fixed interval and a plurality of row members 15 crossing the plurality of column members 13 and arranged in parallel to be spaced at a fixed interval. The coating member 10 includes a plurality of holes 17 formed by the plurality of column members 13 and the plurality of row members 15 that cross each other. When the coating member 10 is coupled to the LED display 30, the plurality of LED elements 32 of the LED display 30 may be inserted into the plurality of holes 17.

Figure 2:
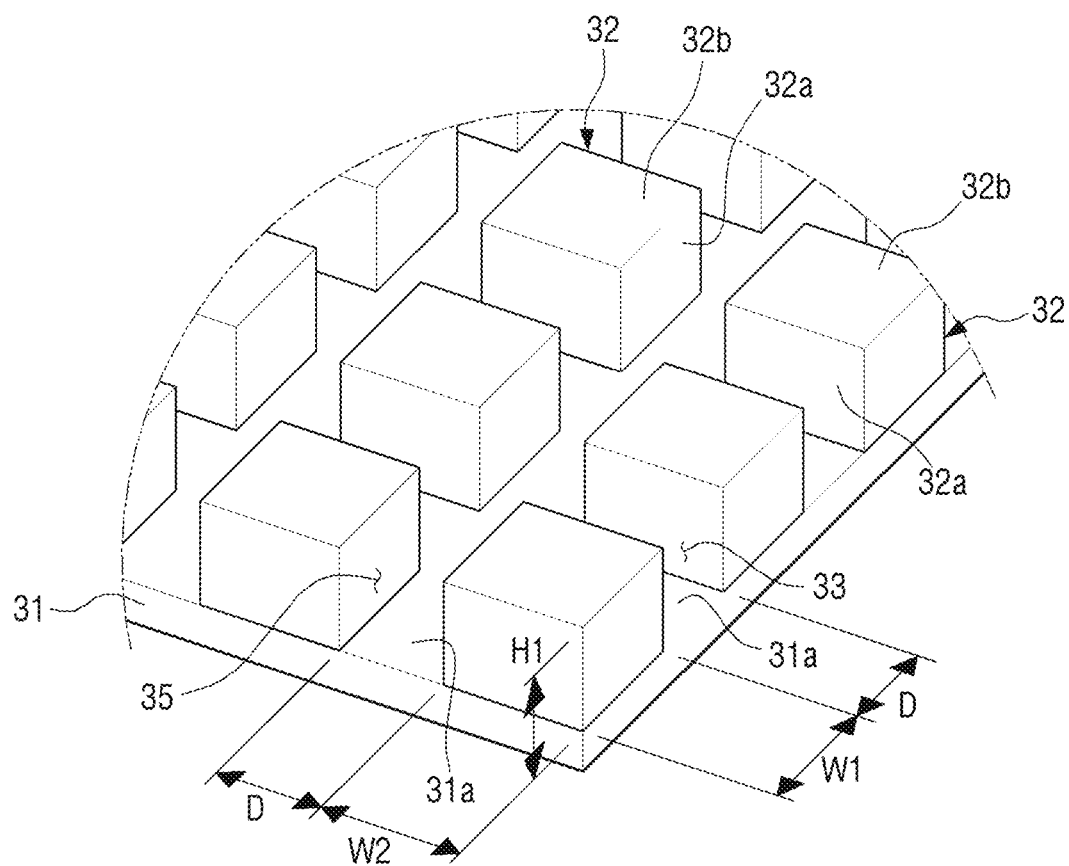
FIG. 2 is an enlarged diagram illustrating a portion III indicated in FIG. 1.

Referring to FIG. 2, the body portion 11 may have a shape corresponding to spaces 33 and 35 formed between the LED elements 32. The shape of the body portion 11 may be determined by the spaces 33 and 35 that form the fine intervals between the LED elements 32. For example, the LED elements 32 mounted on one surface of the PCB 31 may be arranged in a matrix form, and thus the coating member 10 may have the mesh shape so that the spaces 33 between the LED elements 32 in a column and arranged at a fixed interval and the spaces 35 between the LED elements 32 in a row and arranged at a fixed interval, cross each other. In this example, an interval D between the LED elements 32 may have a fine width of about 0.5 mm. Accordingly, the body portion 11 includes the plurality of column members 13 and the plurality of row members 15, and thus the body portion 11 may have a shape corresponding to the spaces 33 and 35 between the LED elements 32.

The shape of the body portion 11 is not limited thereto, but the shape of the body portion 11 may be determined by the shape formed by the spaces between the LED elements 32 that are formed according to the arrangement of the plurality of LED elements 32 in the LED display 30.

A gap between the column members 13 of the body portion 11 corresponds to a longitudinal width W1 of the LED element 32, and a gap between the row members 15 of the body portion 11 corresponds to a lateral width W2 of the LED element 32. The LED element 32 illustrated in FIG. 2 may have a substantially square shape, and thus the LED element 32 may have the longitudinal width W1 and lateral width W2 equal to each other. Accordingly, the column member 13 and the row member 15 of the body portion 11 may have the same width. Hereinafter, a structure of the column member 13 will be described with reference to a cross-section of the column member 13 illustrated in FIGS. 2 and 3.

Figure 3:
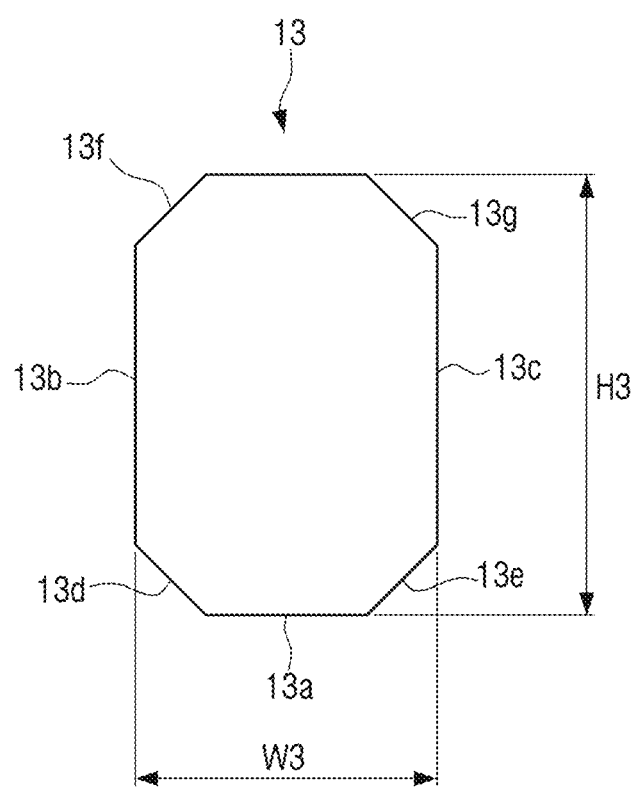
FIG. 3 is a cross-section diagram illustrating a column member illustrated in FIG. 1.

Referring to FIGS. 2 and 3, the column member 13 has a width W3 smaller than or equal to the distance D between the LED elements 32 so that the column member 13 may be inserted into the space 33 of FIG. 2 between the LED elements 32.

The column member 13 has a height H3 smaller than or equal to a height H1 of the LED element 32. For example, the height H3 of the column member 13 may be slightly smaller than the height H1 of the LED element 32. In this example, when the height H1 of the LED element 32 is 0.6 mm, the height H3 of the column member 13 may be in a range of 0.4 mm to 0.5 mm. The height H3 of the column member 13 may prevent a light-emitting surface 32b of the LED element 32 from being covered with the coating member 10 while the column member 13 is melted through a melting process for coating the coating member 10 in the spaces 33 and 35 between the LED elements 32.

A cross-section of the column member 13 may have a substantially octangular shape. A bottom surface 13a of the column member 13 may be placed on one surface 31a of the PCB 31, and a left-side end 13b and a right-side end 13c of the column member 13 may face sides 32a of adjacent LED elements 32 or may be in contact with the sides 32a of the adjacent LED elements 32. When the height H3 of the column member 13 is equal to the height H1 of the LED element 32, inclined surfaces 13d and 13e may be formed in both ends of the bottom surface 13a of the column member 13, and inclined surfaces 13f and 13g may be formed in both ends of a top surface of the column member 13, thus reducing a whole volume of the column member 13. Accordingly, when the column member 13 is melted and then cooled at room temperature, the height H3 of the column member 13 may be formed to be smaller than the height H1 of the LED element 32 (see FIG. 11).

However, the cross-section of the column member 13 is not limited to the octangular shape and may have various shapes.

Figure 4:
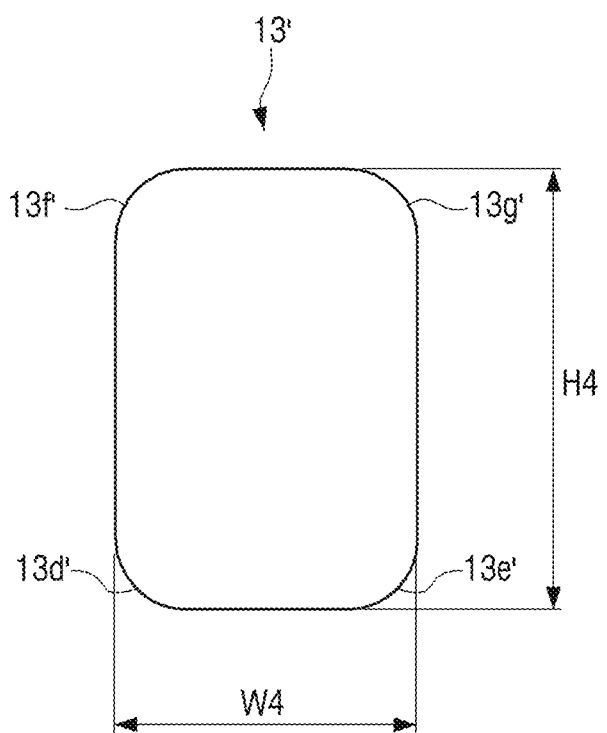
FIGS. 4 and 5 are cross-section diagrams illustrating other examples of the column member illustrated in FIG. 1.
Figure 5:
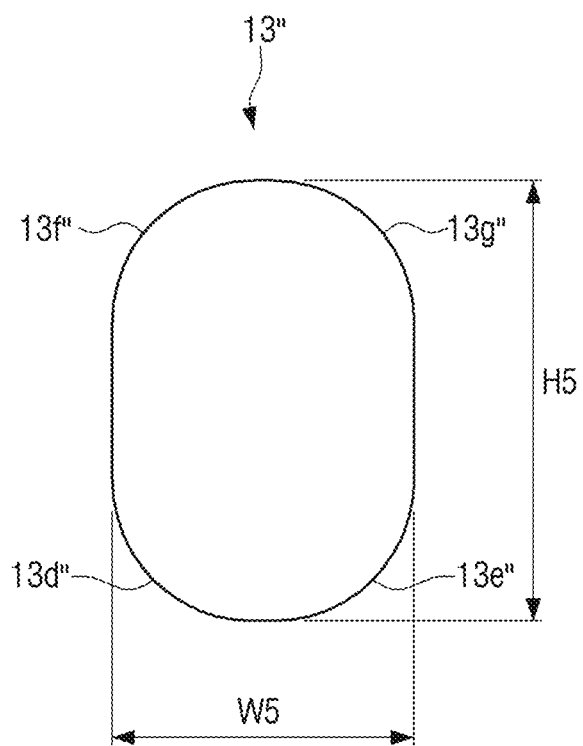

FIGS. 4 and 5 are cross-section diagrams illustrating other examples of the column member illustrated in FIG. 1.

Referring to FIG. 4, a cross-section of a column member 13' may substantially have a rectangular shape, and rounding portions 13d', 13e', 13f', and 13g' having a fixed curvature are formed in both respective ends of a bottom surface and a top surface of the column member 13'. A width W4 and a height H4 of the column member 13' illustrated in FIG. 4 may be set to equal to the width W3 and the height H3 of the column member 13 illustrated in FIG. 3.

Referring to FIG. 5, a cross-section of a column member 13" may substantially have a rectangular shape. Rounding portions 13d", 13e", 13f", and 13g" that have a larger curvature than the rounding portions 13d', 13e', 13f', and 13g' of the column member 13' illustrated in FIG. 4, are formed in both respective sides of a bottom surface and a top surface of the column member 13". For example, the cross-section of the column member 13" has an elliptic shape having a major axis length that is arranged in a direction perpendicular to the one surface of the PCB 31. A width W5 and a height H5 of the column member 13" illustrated in FIG. 5 may be set to be equal to the width W3 and the height H3 of the column member 13 illustrated in FIG. 3.

Referring again to FIG. 1, the coating member 10 may include a material that is phase-changed from a solid state to a liquid state by applied heat of a preset temperature so that the coating member 10 is easily melted in the melting process, and then phase-changed from the liquid state to the solid state again in response to the coating member being placed at room temperature under the phase-changed state to the liquid state. For example, the coating member 10 may include a thermoplastic resin that may satisfy the property of the material described above.

The coating material 10 may have a flexible form. Accordingly, when the LED display 30 is a 3D structure, e.g., a three-dimensionally curved structure, the coating member 10 may be easily deformed to a shape corresponding to the PCB 31 and be easily coupled to the LED display 30. The 3D structure of the LED display 30 will be described later.

Hereinafter, a process of coating a fine interval coating member for an LED display in fine intervals between LED elements of the LED display according to an exemplary embodiment will be sequentially described with reference to FIGS. 6, 7, 8, 9, 10, 11, and 12.

Figure 6:
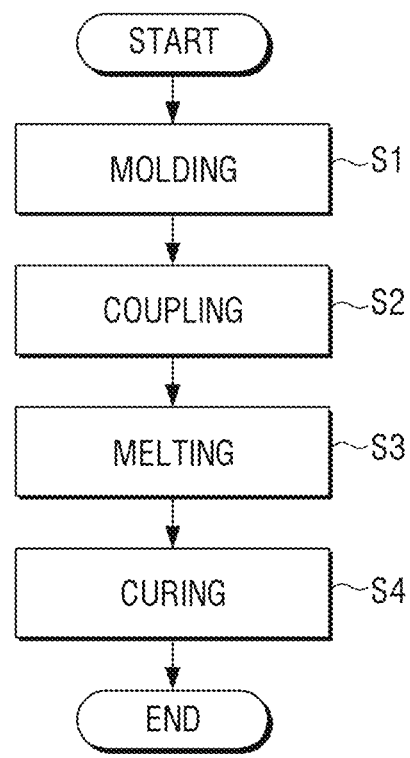
FIG. 6 is a flowchart illustrating a process of coating a fine interval coating member for an LED display, according to an exemplary embodiment.

FIG. 6 is a flowchart illustrating a process of coating a fine interval coating member for an LED display, according to an exemplary embodiment.

Referring to FIGS. 1 and 6, in operation 51, the coating member 10 is molded. For example, the coating member 10 may be manufactured in a shape, for example, a mesh shape corresponding to the spaces 33 and 35 between the LED elements 32 arranged in a matrix form in the PCB 31 having a flat plate form.

The coating member 10 may be manufactured through a molding process using a mold. However, the process of forming the coating member 10 is not limited thereto, and the coating member 10 may be formed through a 3D printer or a laser cutting process. When the coating member 10 is formed through the laser cutting process, a base material having a flat plate shape may be previously prepared. For example, a thickness of the base material may be smaller than or equal to the height of the LED element 32.

Figure 7:
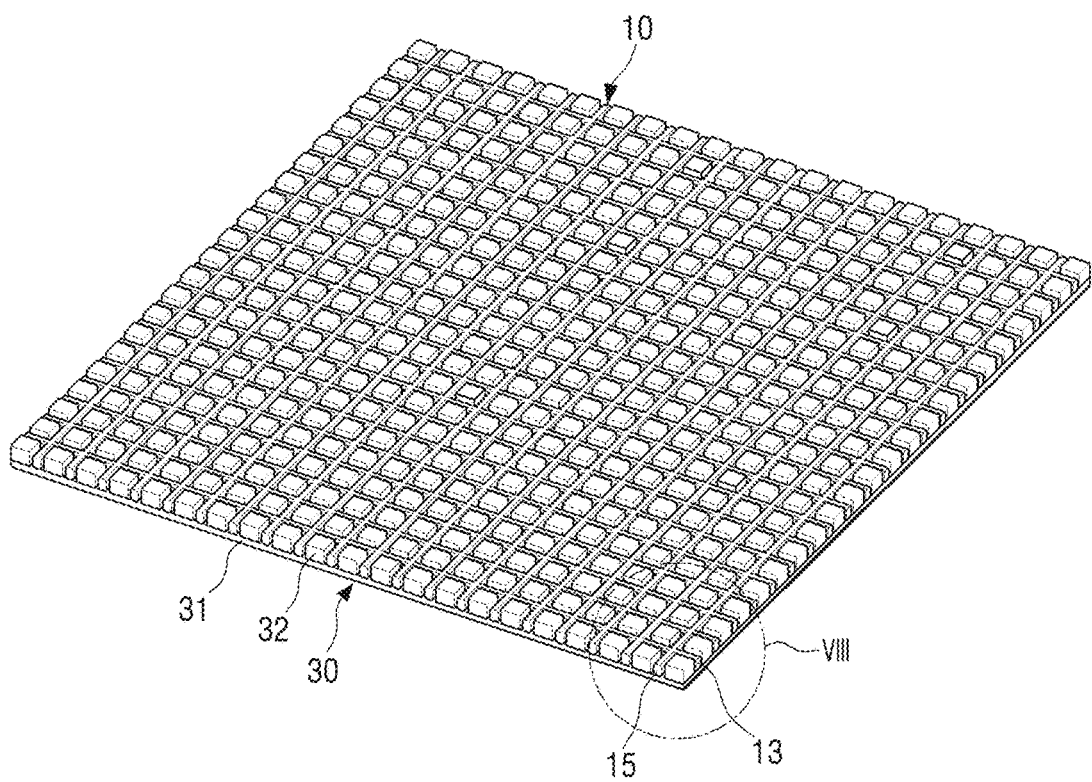
FIG. 7 is a perspective view illustrating a state in which a fine interval coating member is coupled to one surface of an LED display, according to an exemplary embodiment.
Figure 8:
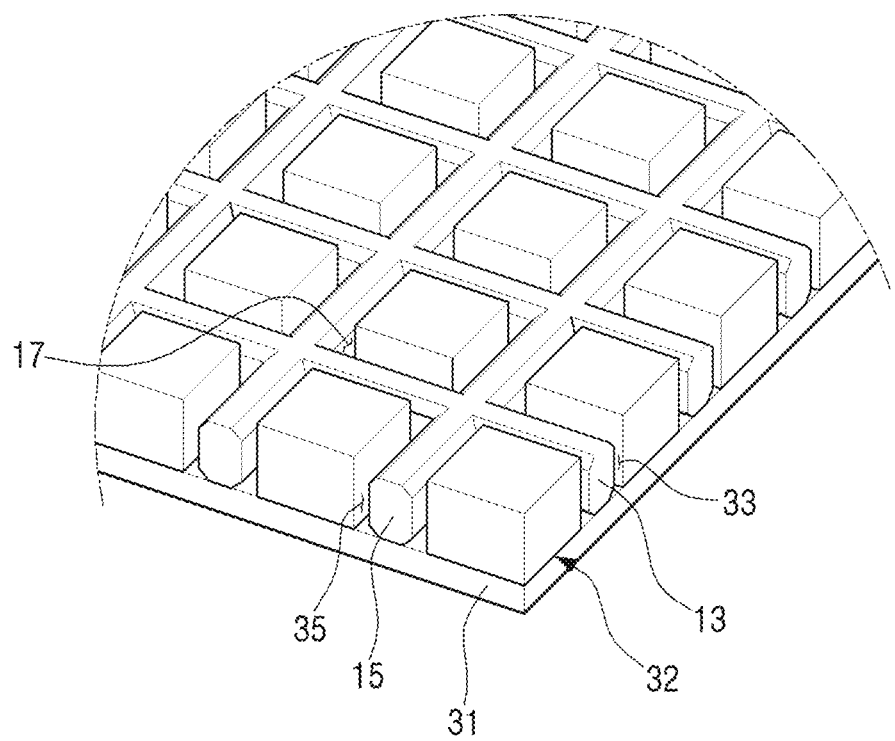
FIG. 8 is an enlarged diagram illustrating a portion VIII indicated in FIG. 7.

In operation S2, the coating member 10 is coupled to the LED display 30 as described in FIGS. 7 and 8.

Figure 9:
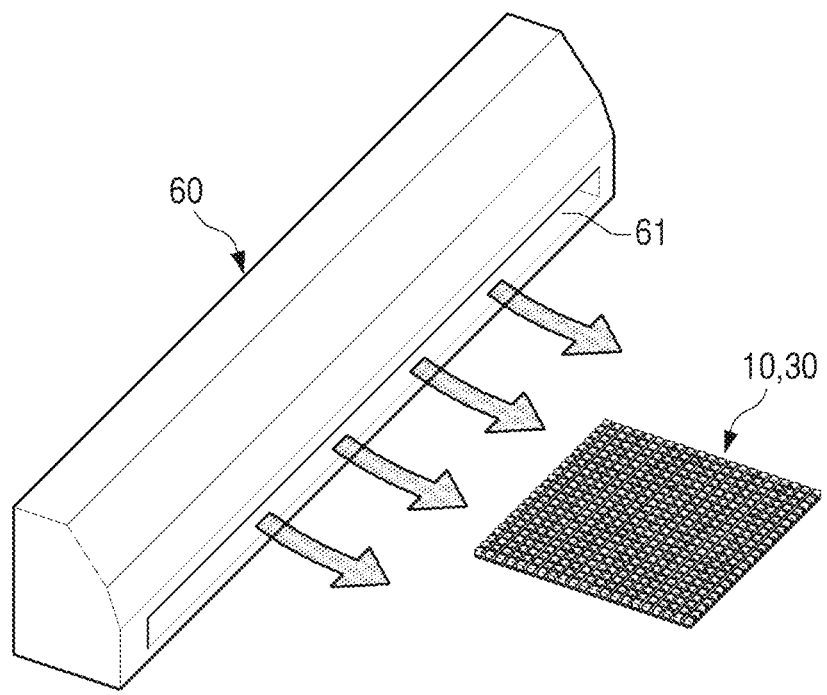
FIG. 9 is a diagram illustrating a process of heating a fine interval coating member inserted into and coupled to a front surface of an LED display, through a hot-air blower, according to an exemplary embodiment.
Figure 10:
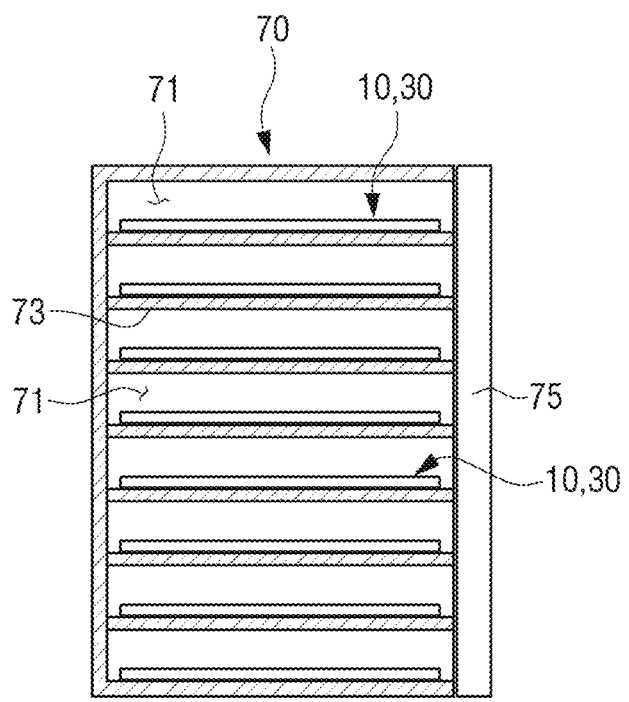
FIG. 10 is a diagram illustrating a process of heating fine interval coating members inserted into and coupled to front surfaces of a plurality of LED displays inside a cabinet type heater in which a plurality of chambers are formed, according to an exemplary embodiment.

In operation S3, the coating member 10 is melted as described in FIGS. 9 and 10.

In operation S4, the coating member 10 is cooled and cured, for example at room temperature.

FIG. 7 is a perspective view illustrating a state in which a fine interval coating member is coupled to one surface of an LED display, according to an exemplary embodiment. FIG. 8 is an enlarged diagram illustrating a portion VIII indicated in FIG. 7.

Referring to FIGS. 7 and 8, the coating member 10 is coupled to the LED display 30. For example, the plurality of column members 13 and the plurality of row members 15 constituting the body portion 11 of the coating member 10 is inserted into the spaces 33 and 35 between the LED elements 32, and thus the plurality of LED elements 32 are inserted into the corresponding plurality of holes 17 of the body portion 11.

FIG. 9 is a diagram illustrating a process of heating a fine interval coating member inserted into and coupled to a front surface of an LED display, through a hot-air blower, according to an exemplary embodiment. FIG. 10 is a diagram illustrating a process of heating fine interval coating members inserted into and coupled to front surfaces of a plurality of LED displays inside a cabinet type heater in which a plurality of chambers are formed, according to an exemplary embodiment.

Referring to FIG. 9, in a state in which the coating member 10 is coupled to the LED display 30, the coating member 10 may be melted by applying heat of a preset temperature.

To melt the coating member 10, the LED display 30 coupled to the coating member 10 is exposed to the hot air through a discharge port 61 of a hot-air blower 60 for a preset time.

Referring to FIG. 10, the coating member 10 coupled to the LED display 30 is loaded into a high-temperature chamber 70, and then the coating member 10 is melted. For example, the high-temperature chamber 70 includes a plurality of spaces 71 divided by partitions 73 to coat the plurality of LED displays 30 once, and an opening may be closed and opened by a door 75. In this example, the high-temperature chamber 70 may be configured to uniformly transfer the hot air emitted from a heater included therein to the spaces 71.

Referring to FIGS. 9 and 10, the coating member 10 may include a material that is melted at a temperature at which the PCB 31 and the LED elements 32 are not affected. For example, the coating member 10 may include a thermoplastic resin such as polyamide or thermoplastic polyurethane (TPU).

The coating member 10 may be melted through heating by the hot-air blower 60 or the high-temperature chamber 70 as described above, but is not limited thereto. For example, the coating member 10 may be melted using a solvent that is coated on the coating member 10. In this example, the solvent may be composed of a component that may not affect the PCB 31 and the LED element 32.

As the coating member 10 is smoothly in completely close contact with the sides 32a of the plurality of LED elements 32 and the one surface 31a of the PCB 31 while the coating material 10 is melted, the coating member 10 may be precisely coated in the LED elements 32 and the PCB 31. Accordingly, when the coating member 10 is coated onto the LED display 30 through the coating method according to the exemplary embodiments, the stable anti-static and waterproof structure may be ensured.

Figure 11:
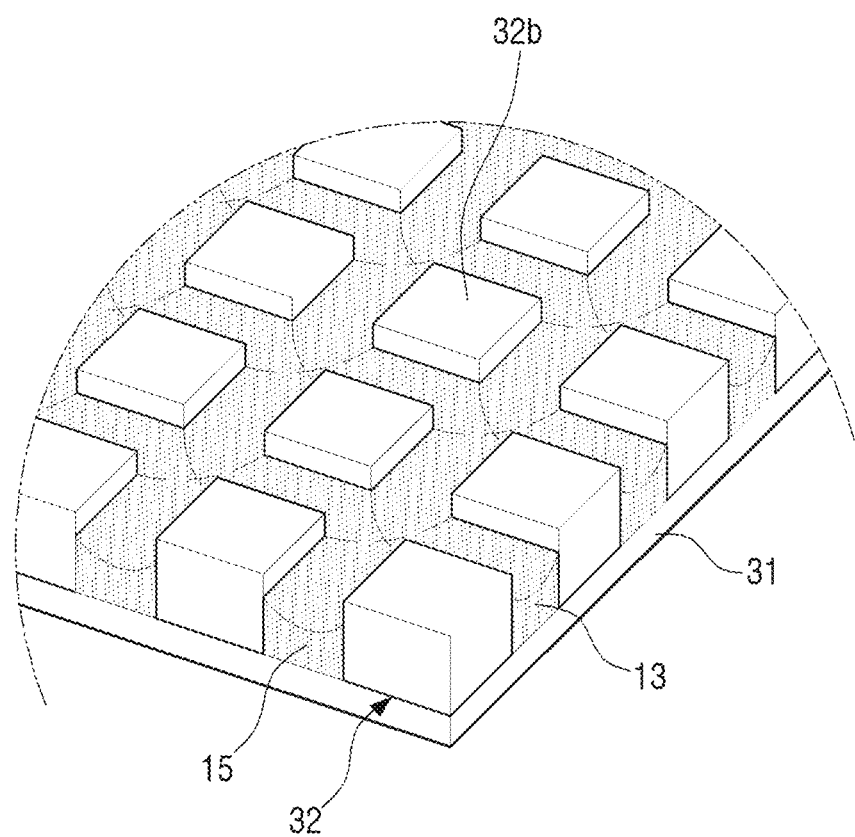
FIG. 11 is a partially-enlarged perspective view illustrating a state in which a fine interval coating member is coated between LED elements, according to an exemplary embodiment.

FIG. 11 is a partially-enlarged perspective view illustrating a state in which a fine interval coating member is coated between LED elements, according to an exemplary embodiment. Referring to FIG. 11, as the heights of the column member 13 and the row member 15 are smaller than that of the LED elements 32, an undesired coating portion, that is, the light-emitting surface 32b of the LED element 32, is not covered or shielded with the coating member 10.

Figure 12:
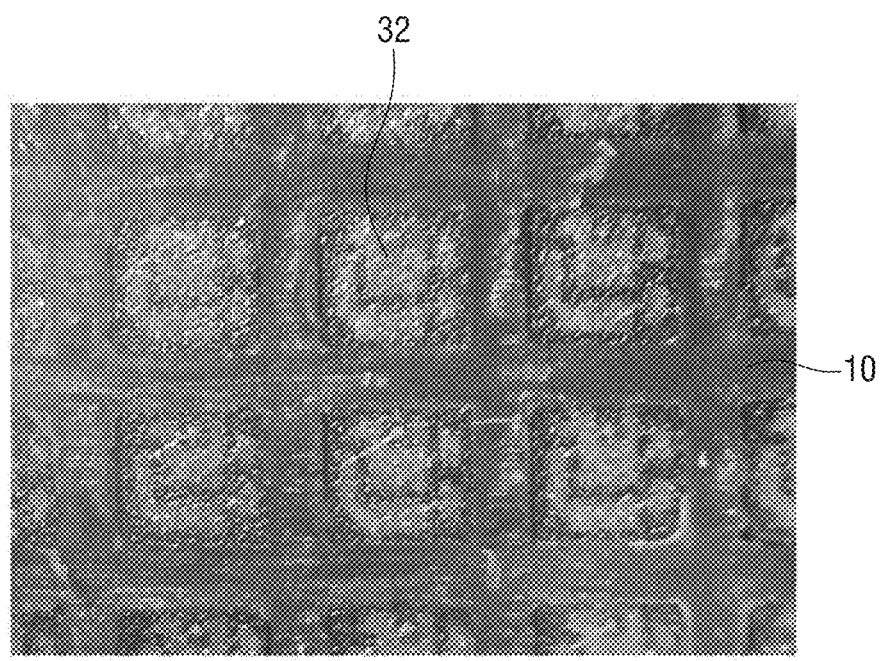
FIG. 12 is a 2D photograph illustrating a state in which a fine interval coating member is coated between LED elements, according to an exemplary embodiment.

FIG. 12 is a 2D photograph illustrating a state in which a fine interval coating member is coated between LED elements, according to an exemplary embodiment. Referring to FIG. 12, the coating member 10 is coated to the LED display 30 to be in completely close contact with the sides 32a of the LED elements 32 in the LED display 30.

As described above, a coating member may be precisely coated in spaces between LED elements arranged at fine intervals, using a coating method according to an exemplary embodiment, and thus the failure rate of products may be considerably reduced.

It has been described that one surface of the LED display 30 is entirely coated through the coating method, but this is not limited thereto. For example, only a desired coating portion of the LED display 30 may be coated through the coating method. In this example, the coating member 10 may have a size corresponding to the desired coating portion.

Figure 13:
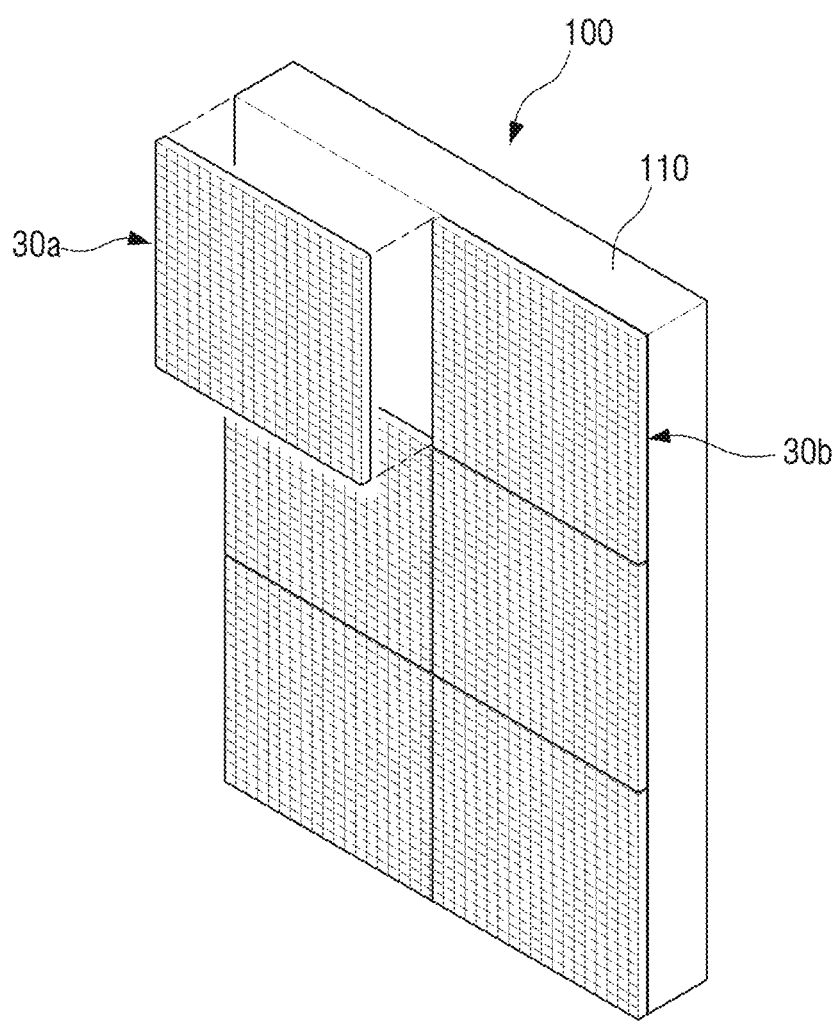
FIG. 13 is a diagram illustrating a process of manufacturing a multi-display apparatus by coupling an LED display coated with a fine interval coating member to another LED display, according to an exemplary embodiment.

FIG. 13 is a diagram illustrating a process of manufacturing a multi-display apparatus by coupling an LED display coated with a fine interval coating member to another LED display, according to an exemplary embodiment.

Referring to FIG. 13, a multi-display 100 is manufactured by coupling a plurality of LED displays 30a and 30b coated with the coating member 10 to one side of a cabinet 110.

A method of simultaneously coating the LED displays 30a and 30b installed adjacent to each other in the cabinet 110 will be described with reference to FIGS. 14, 15, 16, and 17. It may be assumed that only portions of the LED displays 30a and 30b adjacent to each other are coated, and the remaining portions of the LED displays 30a and 30b are not coated.

Figure 14:
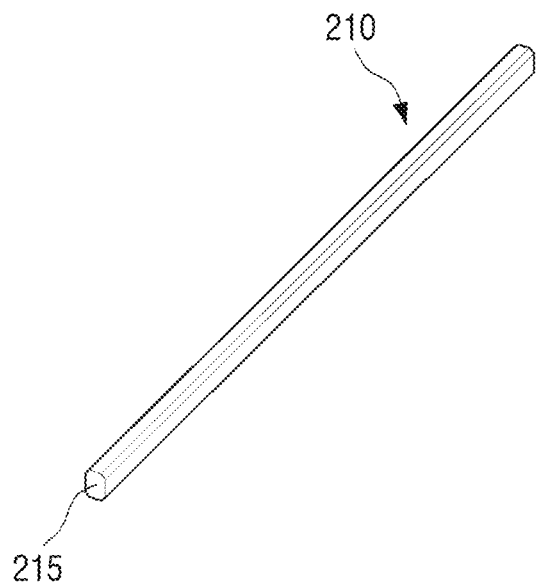
FIG. 14 is a perspective view illustrating a fine interval coating member for fine-interval coating in adjacent LED displays in a multi-display apparatus, according to an exemplary embodiment.
Figure 15:
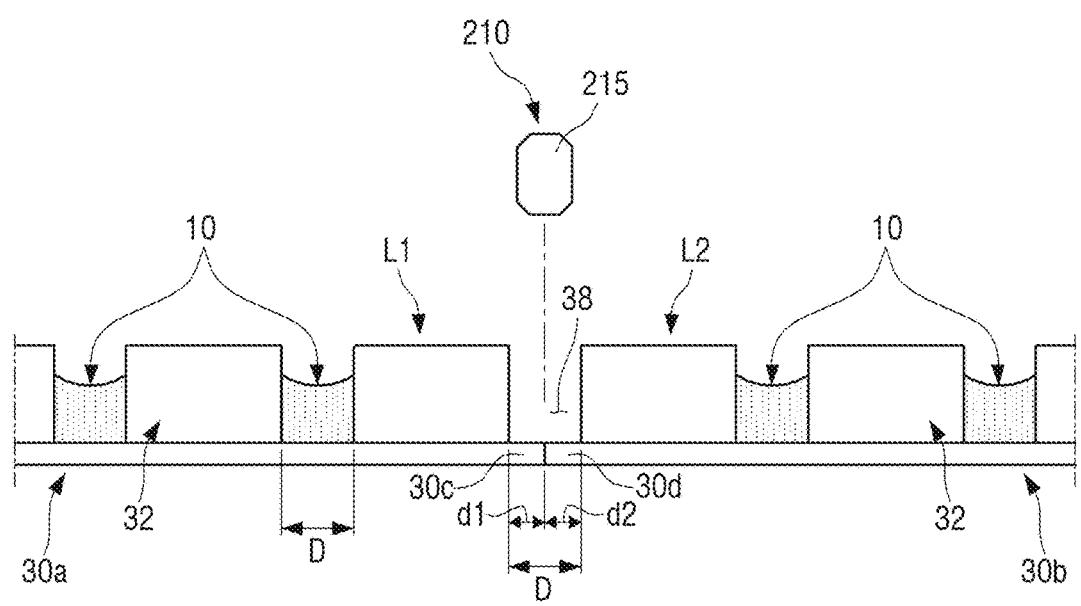
FIGS. 15, 16, and 17 are diagrams sequentially illustrating a process of coating the fine interval coating member illustrated in FIG. 14 in adjacent LED displays, according to an exemplary embodiment.
Figure 16:
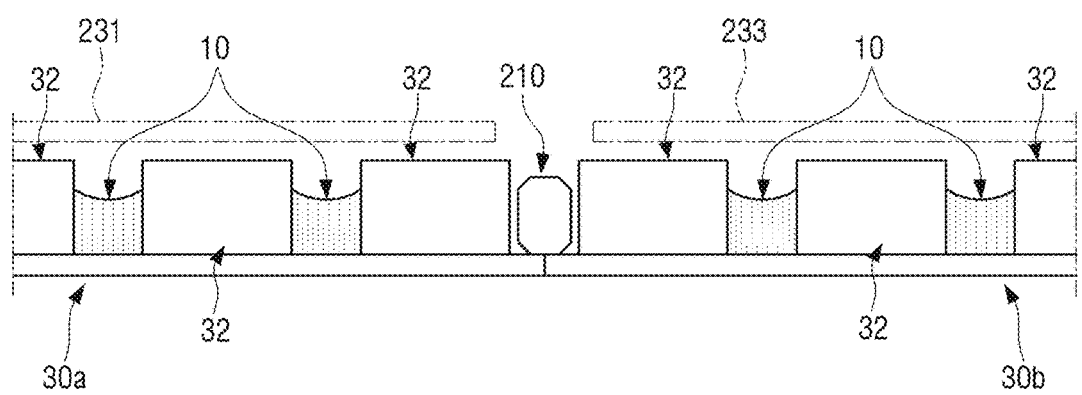
Figure 17:
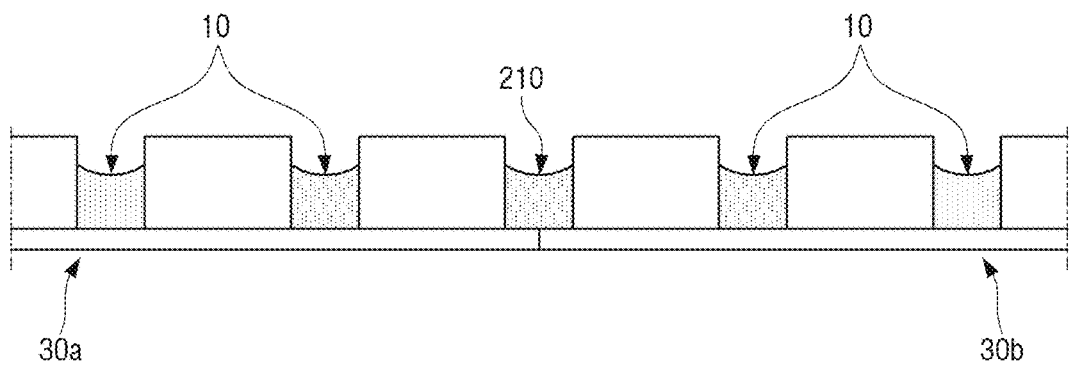

FIG. 14 is a perspective view illustrating a fine interval coating member for fine-interval coating in adjacent LED displays in a multi-display apparatus, according to an exemplary embodiment. FIGS. 15, 16, and 17 are diagrams sequentially illustrating a process of coating the fine interval coating member illustrated in FIG. 14 in adjacent LED displays, according to an exemplary embodiment.

Referring to FIG. 14, a coating member 210 includes only a single row member 215. As illustrated in FIG. 15, edge portions 30c and 30d of the LED displays 30a and 30b adjacent to each other further protrude from LED elements L1 and L2 mounted on the LED displays 30a and 30b, respectively. The edge portions 30c and 30d have distances d1 and d2, respectively. Accordingly, when the LED displays 30a and 30b are coupled to each other, a space 38 is formed between the LED elements L1 and L2 of the LED displays 30a and 30b, respectively, and the coating member 210 is formed to correspond to the space 38.

The coating member 210 may not be necessarily formed to include the column member 13, the row member 15, and the hole 17 formed by the column member 13 and the row member 15, like the coating member 10, and the coating member 210 may have any shape corresponding to a shape of a portion in which the coating member 210 is to coat or be inserted.

The remaining portions of the LED displays 30a and 30b other than the edge portions 30c and 30d are already coated with the mesh-shaped coating member 10 as described above.

Referring to FIG. 16, to coat the coating member 210 in the space 38 between the LED elements 30a and 30b, the coating member 210 is inserted into the space 38.

Next, the coating member 210 may be heated at a preset temperature, using a hot-air blower and the like, to be melted. To avoid melting the coating member 10 already coated in the LED displays 30a and 30b again, exposure of the coating member 10 to the heat is prevented using protection films 231 and 233 including a heat-insulating material.

Referring to FIG. 17, when the coating member 210 is melted and then cooled at room temperature after a preset time, the coating member 210 smoothly coats the space 38 between the LED displays 30a and 30b. Accordingly, the stable coating of the LED displays 30a and 30b may be accomplished, and the robust anti-static and water-proof structure may be obtained.

Because the coating member according to an exemplary embodiment may have flexible form, it may finely coat even a LED display having a preset 3D curve. This example will be described with reference to FIGS. 18, 19, 20, and 21.

Figure 18:
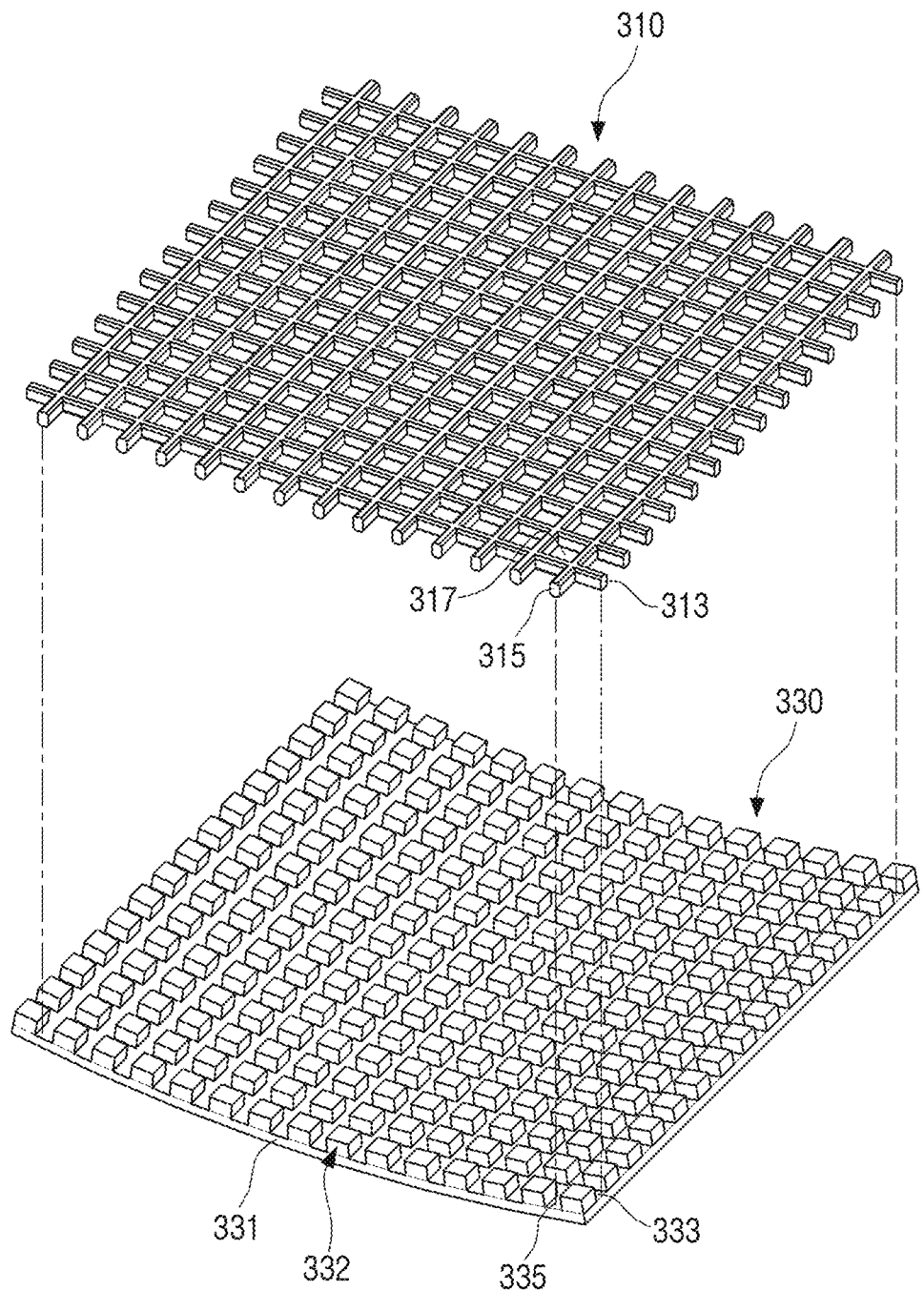
FIG. 18 is an exploded perspective view illustrating a fine interval coating member that is applied to a curved LED display, according to an exemplary embodiment.
Figure 19:
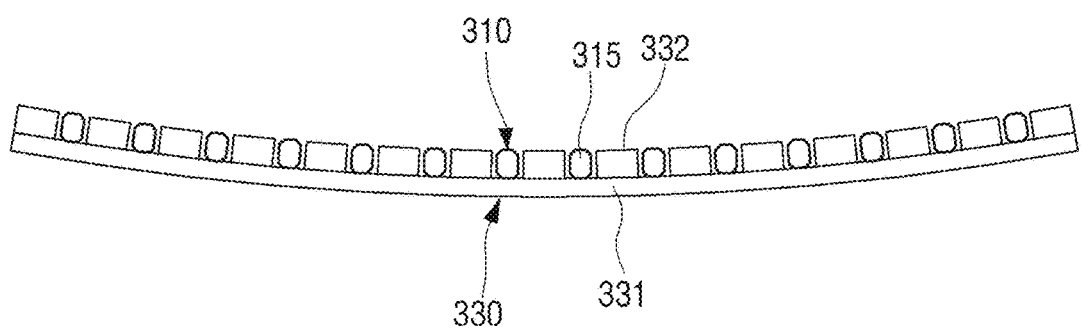
FIG. 19 is a diagram illustrating a state in which the fine interval coating member illustrated in FIG. 18 is coupled to the curved LED display illustrated in FIG. 18.
Figure 20:
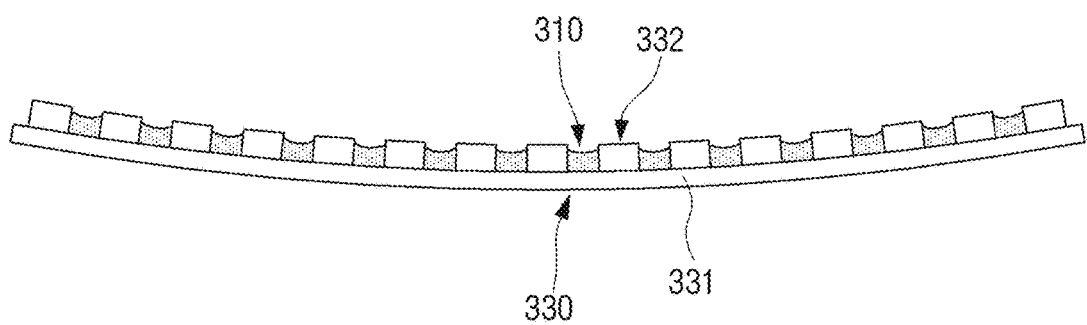
FIG. 20 is a diagram illustrating a state in which the fine interval coating member illustrated in FIG. 19 is coated between LED elements illustrated in FIG. 19.
Figure 21:
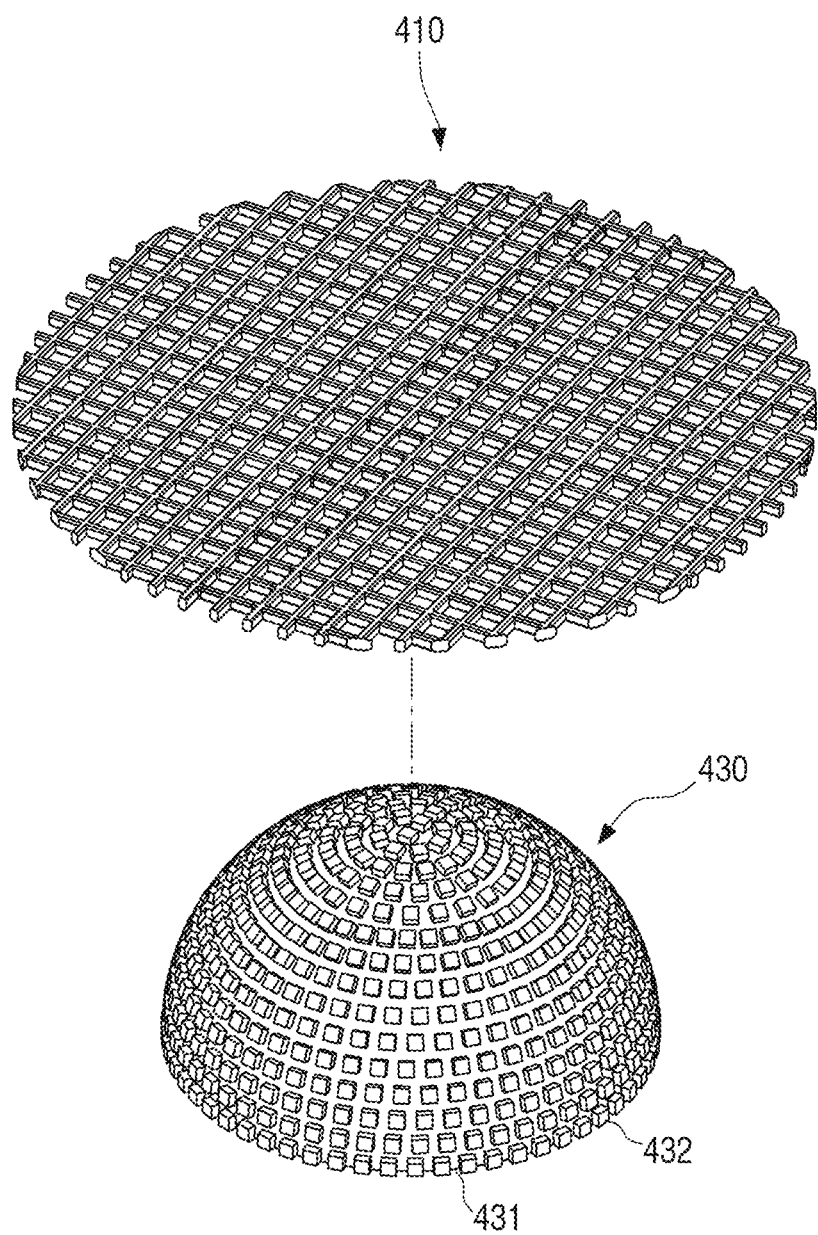
FIG. 21 is an exploded perspective view illustrating a fine interval coating member that is applied to a hemispherical LED display, according to an exemplary embodiment.

FIG. 18 is an exploded perspective view illustrating a fine interval coating member that is applied to a curved LED display, according to an exemplary embodiment. FIG. 19 is a diagram illustrating a state in which the fine interval coating member illustrated in FIG. 18 is coupled to the curved LED display illustrated in FIG. 18. FIG. 20 is a diagram illustrating a state in which the fine interval coating member illustrated in FIG. 19 is coated between LED elements illustrated in FIG. 19. FIG. 21 is an exploded perspective view illustrating a fine interval coating member that is applied to a hemispherical LED display, according to an exemplary embodiment.

Referring to FIG. 18, a LED display 330 is a curved LED display having a fixed curvature and including a PCB 331 and LED elements disposed on the PCB 331. Spaces 333 and 335 are disposed between the LED elements 332. A coating member 310 includes a plurality of column members 313 crossing a plurality of row members 315, forming a plurality of holes 317.

Referring to FIG. 19, as the coating member 310 has a flexible form, the coating member 310 may be smoothly deformed to correspond to a shape of the LED display 330, and is inserted into the spaces 333 and 335 between the LED elements 332.

As illustrated in FIG. 20, when the coating member 310 is coupled to the LED display 330, the coating member 310 coats the LED display 330 to be in completely close contact with a bonding portion between the LED elements 332 and the PCB 331, through a melting and cooling process.

Referring to FIG. 21, a coating member 410 according to an exemplary embodiment may coat an LED display 430 that has a PCB 431 substantially having a hemispherical shape, on which a plurality of LED elements 432 are disposed. This is because as the coating member 410 has a flexible form as described above, the coating member 410 may be deformed to correspond to a shape of the LED display 430 when the coating member 410 is coupled to the LED display 430.

The coating members 10, 210, 310, and 410 according to the exemplary embodiments may coat an LED display with good quality even when the LED display has various 3D curved forms, or when depths of portions of the LED display to be coated are different from each other.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:
1. A display comprising:
    a printed circuit board (PCB);
    light emitting diode (LED) elements disposed on the PCB; and
    a coating member comprising:
        a body portion comprising column portions and row portions crossing the column portions, the body portion being disposed between the LED elements and disposed on the PCB; and
        holes between the column portions and the row portions and into which the LED elements are inserted,
    wherein the body portion comprises a material that is melted at a temperature higher than room temperature and that is cured at the room temperature, and
    wherein a height of a top surface of the body portion is less than a height of a top surface of the LED elements.

2. The display as claimed in claim 1, wherein a width of each of the column portions and the row portions is less than or equal to a distance between each adjacent pair of the LED elements.

3. The display as claimed in claim 1, wherein a height of a top surface of each of the column portions and the row portions is less than or equal to a height of a top surface of each of the LED elements.

4. The display as claimed in claim 1, wherein the body portion is deformed to a shape corresponding to a surface of PCB.

5. The display as claimed in claim 1, wherein each cross-section of the column portions and the row portions comprises a top surface and a bottom surface, the top surface comprising ends that comprise inclined surfaces inclining toward the bottom surface, and the bottom surface comprising ends that comprise inclined surfaces inclining toward the top surface.

6. The display as claimed in claim 1, wherein each cross-section of the column portions and the row portions comprises a top surface and a bottom surface, the top surface comprising ends that comprise rounding portions having a curvature, and the bottom surface comprising ends that comprise rounding portions having the curvature.

* * * * *